(12) United States Patent
Andre et al.

(10) Patent No.: US 7,532,533 B2
(45) Date of Patent: May 12, 2009

(54) ANTIFUSE CIRCUIT AND METHOD FOR SELECTIVELY PROGRAMMING THEREOF

(75) Inventors: Thomas W. Andre, Austin, TX (US); Chitra K. Subramanian, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 11/737,506

(22) Filed: Apr. 19, 2007

(65) Prior Publication Data
US 2007/0188190 A1   Aug. 16, 2007

Related U.S. Application Data

(62) Division of application No. 11/166,139, filed on Jun. 24, 2005, now Pat. No. 7,224,630.

(51) Int. Cl.
*G11C 17/18* (2006.01)
(52) U.S. Cl. ............... 365/225.7; 365/94; 365/96; 365/97; 365/158; 365/171; 365/173; 365/207; 365/209; 365/210
(58) Field of Classification Search ............... 365/94, 365/96, 97, 158, 171, 173, 207, 209, 210, 365/225.7
See application file for complete search history.

(56) References Cited

U.S. PATENT DOCUMENTS

| 6,324,093 | B1 | 11/2001 | Perner et al. |
| 6,545,928 | B1 * | 4/2003 | Bell ..................... 365/225.7 |
| 6,778,426 | B2 * | 8/2004 | Hosotani .................. 365/158 |
| 6,903,991 | B2 * | 6/2005 | Mullarkey et al. ....... 365/225.7 |
| 2006/0092689 | A1 | 5/2006 | Braun et al. |

* cited by examiner

*Primary Examiner*—Van Thu Nguyen
(74) *Attorney, Agent, or Firm*—Ingrassia, Fisher & Lorenz, P.C.

(57) ABSTRACT

An antifuse circuit provides on a per bit basis a signal that indicates whether an MTJ (magnetic tunnel junction) antifuse has been previously programmed to a low resistance state in response to a program voltage. A sense amplifier provides the resistance state signal. A plurality of reference magnetic tunnel junctions are coupled in parallel and to the sense amplifier, each having a resistance within a range to provide a collective resistance that can be determined by the sense amplifier to differ from each resistance state of the MTJ antifuse. A write circuit selectively provides a current sufficient to create the program voltage when the write circuit is enabled to program the antifuse magnetic tunnel junction. Upon detecting a change in resistance in the MTJ antifuse, the write circuit reduces current supplied to the antifuse. Multiple antifuses may be programmed concurrently. Gate oxide thicknesses of transistors are adjusted for optimal performance.

1 Claim, 3 Drawing Sheets

ANTIFUSE CIRCUIT AND METHOD FOR SELECTIVELY PROGRAMMING THEREOF

FIELD OF THE INVENTION

This invention relates generally to integrated circuits, and more particularly to antifuses used in integrated circuits.

RELATED ART

Fusing has been commonly used in integrated circuits, particularly for implementing redundancy in memories, but also making circuit adjustments such as timing and bias conditions. This has most commonly been done using laser fusing techniques which require a separate pass through equipment that performs this function which in turn results in added test costs. To reduce these added costs, work has been done to develop electrically programmable fuses and antifuses. One of the difficulties in this regard is achieving sufficient reliability while using reasonable voltages. Excessively high voltages are often required for effective programming. The use of magnetic tunnel junction (MTJ) devices has shown promise of reducing the required voltage level. MTJ devices have generally been difficult to manufacture in a manner that results in their electrical operating characteristics being relatively uniform. The variations tend to be significant not only from wafer to wafer but also from die to die. Further, changes in the process also can significantly alter the electrical characteristics. Also, time of programming, although reduced from using lasers, is still longer than desirable.

Thus there is a need for fuses and/or antifuses that can be programmed at relatively low voltages in the presence of variations in electrical operating characteristics and similarly being able to effectively read the state of the fuse or antifuse. Another need is to reduce the time required for programming fuses and/or antifuses. In all these situations it is also desirable to keep the area on the integrated circuit as low as possible while maintaining reliable operation.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

In one aspect, a reference used for reading the state of an MTJ antifuse includes unprogrammed MTJ devices in parallel to set a reference resistance. The MTJs in parallel provide a resistance that is between the programmed and unprogrammed resistance of the MTJ antifuse. With the reference being made up of the same construction as the MTJ antifuse, the reference is relatively effective in tracking the changes in operating characteristics due to variations in the manufacturing process. Further, the number of MTJ devices in parallel is selectable so that the resistance level can be adjusted to obtain the optimum reference resistance. This is particularly significant because of the variation in resistance among the unprogrammed MTJ antifuses. The reference resistance needs to always be detectably below the unprogrammed resistance of even the one with the lowest unprogrammed resistance. The reference and MTJ antifuse are protected from the higher voltage used in the sense amplifier by a pass transistor that is made to handle higher voltages in order to protect the MTJ devices from the higher voltage that could exceed the breakdown voltage of the MTJ devices. Similarly, these pass devices also protect the sense amplifier from the somewhat high voltages used by a write circuit during programming. Also the write circuit responds to a breakdown of the MTJ antifuse by reducing the current flow, which enables the current to more quickly be used elsewhere. This is better understood with reference to the FIGs. and the following description.

Figure 1:
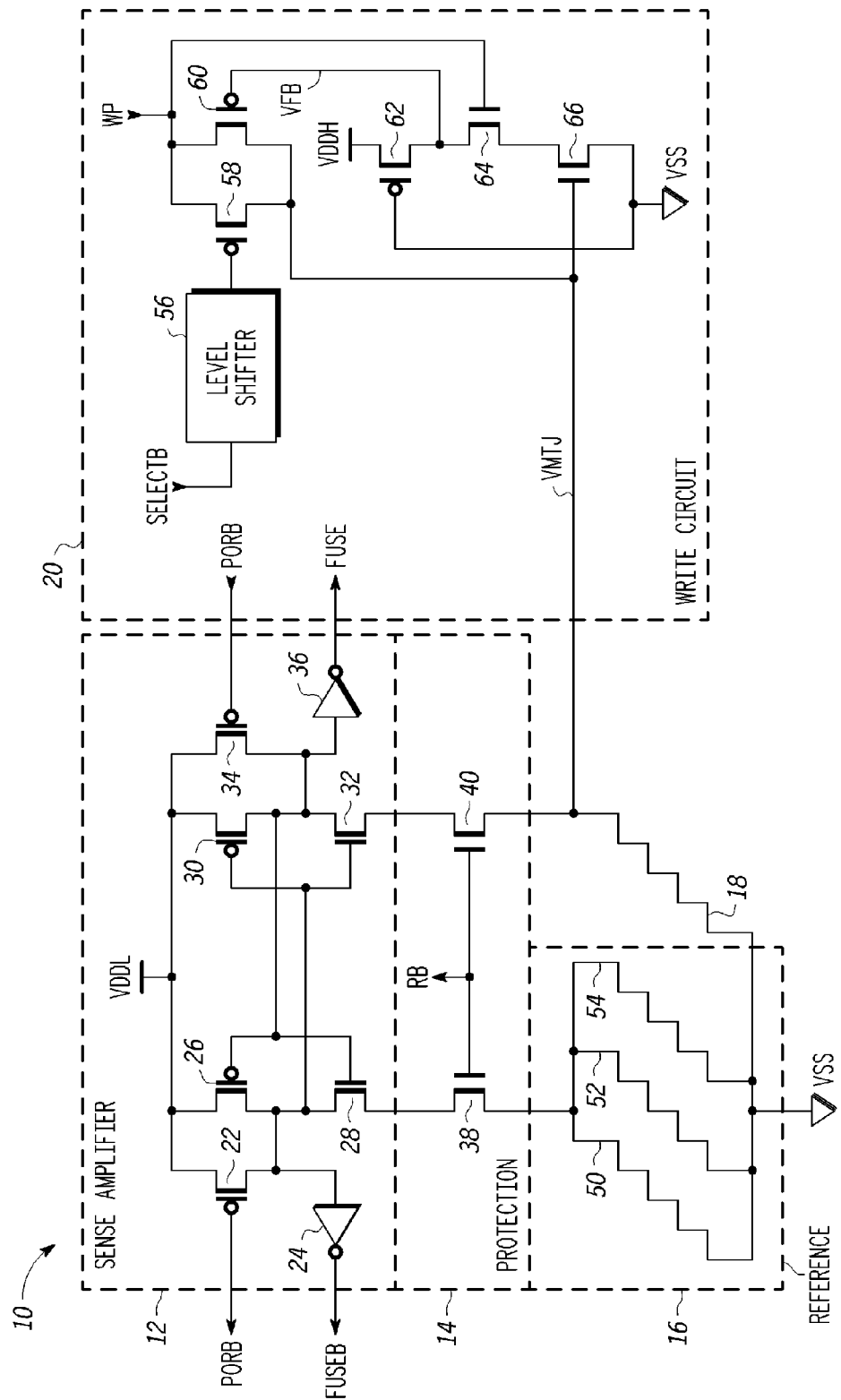
FIG. 1 is a circuit diagram of an antifuse circuit according to an embodiment of the invention.

Shown in FIG. 1 is a antifuse circuit 10 comprising a sense amplifier 12, a protection circuit 14, a reference 16, an antifuse 18, and a write circuit 20. Antifuse 18 in this described embodiment is a magnetic tunnel junction (MTJ) device. Although the antifuse circuit 10 is potentially applicable to other types of antifuses or even fuses, an MTJ device is particular beneficial because of its relatively low voltage requirements for programming.

Sense amplifier 12 comprises P channel transistor 22, inverter 24, a P channel transistor 26, an N channel transistor 28, a P channel transistor 30, an N channel transistor 32, a P channel transistor 34, and an inverter 36. Protection circuit 14 comprises N channel transistor 38 and N channel transistor 40. Reference circuit 16 comprises MTJ devices 50, 52, and 54. Write circuit 20 comprises level shifter 56, a P channel transistor 58, a P channel transistor 60, P channel transistor 62, N channel transistor 64, and N channel transistor 66. Transistors 38, 40, 58, 60, 62, 64, and 66 are all transistors that are made specially to handle higher voltages. This is commonly achieved by increasing the gate dielectric thickness. Thus, P channel transistors 58, 60, and 62 have a greater breakdown voltage than P channel transistors 22, 26, 30, and 34. Similarly, N channel transistors 38, 40, 64, and 66 have a greater breakdown voltage than N channel transistors 28 and 32. It is common for integrated circuits to have transistors with different breakdown voltages for this purpose of being able to handle different voltages. The lower breakdown transistors are for higher performance and lower power. In a typical application, VDDL is for logic devices and VDDH is for input/output circuits. Sense amplifier 12 is powered by low power supply VDDL, and write circuit 20 is powered by high power supply voltage VDDH. A nominal voltage for VDDL in this example is 1.8 volts, and VDDH in this example is 3.3 volts.

Transistor 22 has a gate for receiving a power on reset (POR) signal PORB (B is used to indicate an active logic low signal), a source connected to VDDL, and a drain. Inverter 24 has an input connected to the drain of transistor 22 and an output for providing a complementary output signal FUSEB. Transistor 26 has a source connected to VDDL, a drain connected to the drain of transistor 22, and a gate. Transistor 28 has a drain connected to the drain of transistor 26, a gate connected to the gate of transistor 26, and a source. Transistor 30 has a source connected to VDDL, a gate connected to the drains of transistors 26 and 28, and a drain. Transistor 32 has a drain connected to the drain of transistor 30, a gate connected to the gate of transistor 30, and a source. Transistor 34 has a source connected to VDDL, a gate for receiving POR signal PORB, and a drain connected to the drains of transistors 30 and 32. Inverter 36 has an input connected to the drain of transistors 34, 32, and 30, and an output for providing output signal FUSE.

Transistor 38 has a drain connected to the source of transistor 28, a gate for receiving a read bias voltage RB, and a source. Transistor 40 has a drain connected to the source of transistor 32, a gate for receiving read bias voltage RB, and a source. Sense amplifier 12 and protection circuit 14 can together be considered a sensing circuit.

MTJs 50, 52, and 54 each have a first terminal connected to the source of transistor 38 and a second terminal connected to a negative power supply terminal VSS. VSS is typically ground. Antifuse 18 has a first terminal connected to the source of transistor 40 and a second terminal connected to VSS. The first terminal of antifuse 18 provides an MTJ voltage VMTJ for assisting in the control of current in write circuit 20.

Level shifter 56 has an input for receiving a select signal SELECT B and an output. Transistor 58 has a source for receiving a write power signal WP, a gate connected to the output of level shifter 56, and a drain connected to the first terminal of antifuse 18. Transistor 60 has a source for receiving write power signal WP, a drain connected to the drain of transistor 58, and a gate. Transistor 62 has source connected to VDDH, a drain connected to the gate of transistor 60, and a gate connected to VSS. The drain of transistor 62 provides a foldback voltage VFB. Transistor 64 has a drain connected to the drain of transistor 62, a gate for receiving write power signal WP, and a source. Transistor 66 has a drain connected to the source of transistor 64, a gate connected to the first terminal of MTJ 18, and a source connected to VSS.

Figure 2:
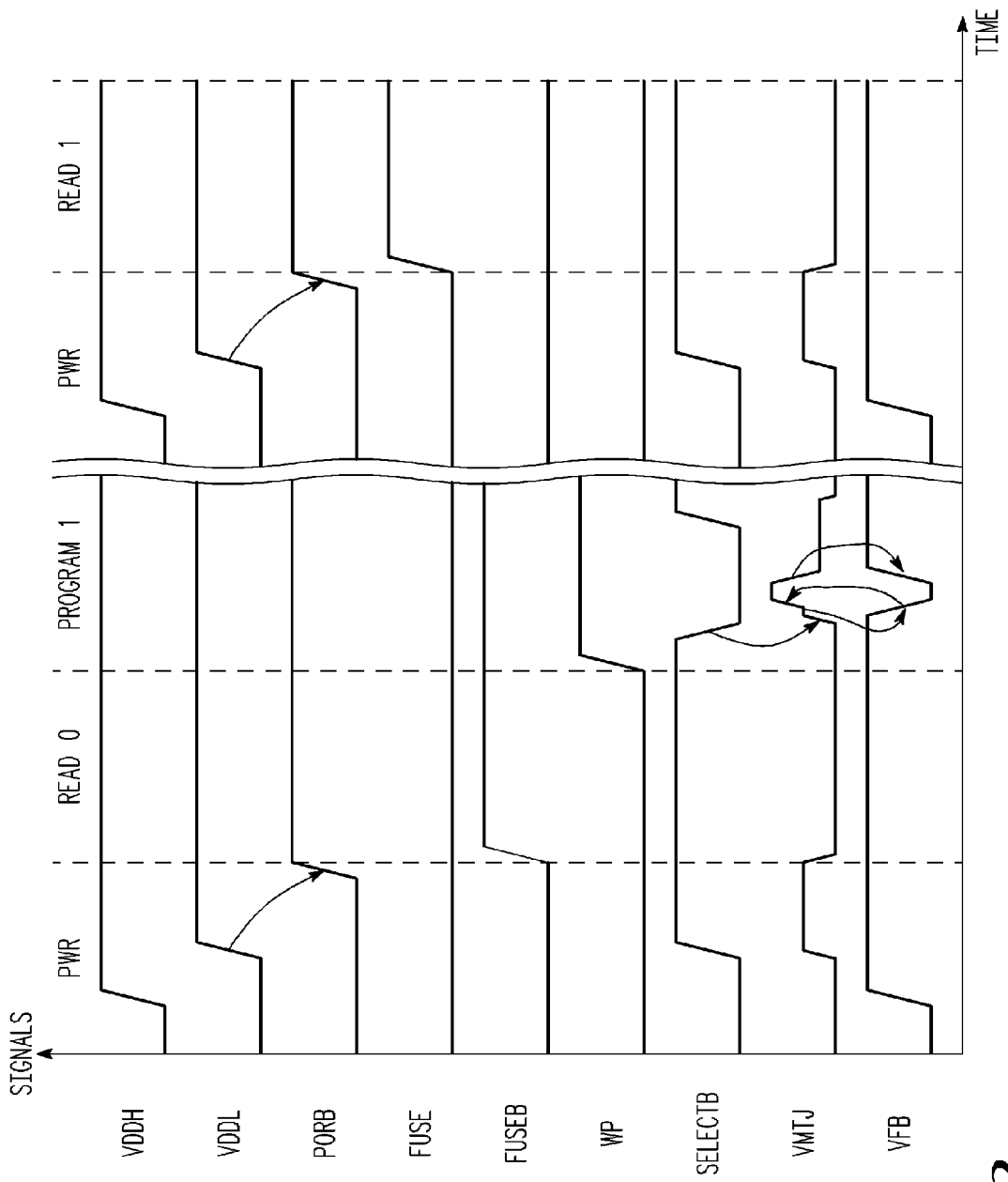
FIG. 2 is a timing diagram useful in understanding the operation of the antifuse circuit of FIG. 1.

The operation of antifuse circuit 10 is described in conjunction with the timing diagram of FIG. 2. At power-up, POR signal PORB is a logic low for a sufficient time for the power to stabilize and the circuits to respond. In this initial logic low condition, transistors 22 and 34 are conductive causing inverters 24 and 36 to output a logic low. As VDDH and VDDL rise in voltage toward their ultimate voltage, the select signal SELECTB, MTJ voltage VMTJ, and foldback voltage VFB also rise. The rise of VDDL is delayed in relation to the rise of VDDH. The rise in VDDL is detected and, after an intended delay, POR signal PORB is brought to the inactive logic high condition. In response to POR signal PORB becoming inactive, FUSE and FUSEB become complementary and VMTJ becomes a logic low. SELECTB remains at a logic high in the inactive state.

In this example, antifuse 18 has not been programmed yet so at this time a logic low (also logic 0) is being read. In this case, the resistance of MTJs 50, 52, and 54 in parallel is lower than the resistance of antifuse 18. This results in the drain of transistor 28 being at a lower voltage than the drain of transistor 32 at the time PORB releases control of sense amplifier 12 by switching to a logic high causing transistors 22 and 34 to become non-conductive. This has the effect of sense amplifier 12 having a logic high on the drains of transistors 30 and 32 to cause output signal FUSE to be at a logic low, and correspondingly the drains of transistors 26 and 28 are at a logic low to cause output signal FUSEB to be at a logic high. With SELECTB at a logic high, level shifter 56 provides a logic high to transistor 58 so that transistor 58 is non-conductive. Write power signal WP is at a logic low so that transistor 64 is non-conductive. Transistor 62 is conductive to provide a logic high to the gate of transistor 60 so that transistor 60 is non-conductive. With transistors 58 and 60 non-conductive, VMTJ is controlled by antifuse 18.

In the case where antifuse 18 is programmed, as shown in FIG. 2, write power WP is brought to the programming level, which is substantially the same voltage that is at VDDH, which in this example is about 3.3 volts. Transistors 58 and 60 are still non-conductive so that VMTJ is unchanged. After WP has been raised to the programming level, SELECTB is brought to a logic low to initiate actual programming. In response to SELECTB being a logic low, level shifter 56 provides a logic low to the gate of transistor 58 causing transistor 58 to become conductive. Transistor 64 is conductive because of WP being at the programming level. Transistor 66 is also conductive because transistor 58, being conductive, provides a sufficiently high voltage to the gate of transistor 66 to make it conductive. With transistors 64 and 66 conductive, the voltage at the gate of transistor 60 is sufficiently low to make transistor 60 conductive. In this case, transistor 60 preferably carries more current than transistor 58. The intent is to bring the voltage level of VMTJ sufficiently high to breakdown antifuse 18. With antifuse 18 being an MTJ, the breakdown voltage is normally 1.8 volts or lower. The voltage of VMTJ is nearly 3.3 volts with both transistors 58 and 60 being conductive. Transistors 38 and 40 are biased to prevent this high voltage from reaching sense amplifier 12. The voltage of read bias RB is a threshold voltage above the voltage that is necessary for reliably reading the state of antifuse 18.

In this example, read bias voltage RB is about 1.2 volts. This voltage must be sufficiently low to ensure that the MTJ breakdown is not reached during a read. This bias is not changed between reading and programming. With VMTJ at 3.3 volts, sense amplifer 12 is protected by protection circuit 14, and antifuse 18 breaks down and becomes greatly more conductive. A typical change for antifuse 18 being an MTJ device is from tens of thousands of ohms to hundreds of ohms; for example from 20 thousand ohms to 2 hundred ohms. This has the effect of reducing the voltage on the gate of transistor 66 below its threshold voltage so that it becomes non-conductive. With transistor 66 non-conductive, the drain of transistor 62 becomes a logic high which causes transistor 60 to become non-conductive. With transistor 60 non-conductive, current through antifuse 18 is limited by the current through transistor 58. This reduces the load on write power WP signal so that other circuits may be able to receive more current from write power signal WP. The continuing flow of current through antifuse 18 being achieved through transistor 58 is believed to be beneficial in ensuring that antifuse 18 achieves at least the low resistance that is expected.

The FUSE and FUSEB outputs probably will not change during programming because sense amplifier 12 is a latch. Thus, after programming, the power needs to be reset. As previously described for switching the power on, POR signal PORB is generated at a logic low that keeps the drains of transistors 26 and 32 both at the same voltage which is recognized as a logic high by inverters 24 and 36. During the active portion of PORB, SELECTB is raised to a logic high so that transistor 58 is non-conductive. After VDDL has reached its desired level for a predetermined delay time, POR signal PORB is brought to the inactive logic high state. At this point in time, the drains of transistors 28 and 32 are being held at substantially the same voltage by transistors 22 and 34 but transistor 30 is carrying more current than transistor 26 due to the resistance of antifuse 18 being lower than that of reference 16. Thus transistor 30 drops more voltage than transistor 26 so that the voltage on the drain of transistor 32 is at a little lower voltage than the voltage on the drain of transistor 28 at the time transistors 22 and 34 become non-conductive due to PORB going to a logic high. Sense amplifier 12 then latches with the voltage on the drain of transistor 32 at the relatively lower voltage so that a logic low is latched onto the drain of transistor 32 and a logic high is latched onto the drain of transistor 28. In this condition FUSE is a logic high and FUSEB is a logic low. Write circuit 20 has transistors 58, 60, 64 and 66 non-conductive. Transistor 62 is conductive but is in series with transistors that are non-conductive so does not draw current.

The use of three MTJ devices in parallel ensures that reference 16 has a resistance that is well below that of antifuse 18 when unprogrammed. In the unprogrammed state, the resistance of antifuse 18 can vary substantially due in part to process variation but also because of the variable magnetic character of an MTJ device. The resistance of the MTJ will differ based on that magnetic state. It is this difference in resistance based on magnetic state that makes it useful as part of a memory cell in a memory array. Thus, by its nature an MTJ is not predictable as to its resistance. Thus, even the three references may be in different magnetic state. The worst case condition is when the reference MTJs are in the high resistive magnetic state and the antifuse is in the low resistive magnetic state. In the case of three MTJs in parallel, the reference is safely lower in resistance than the antifuse. The programmed state is a achieved in a non-reversible process that physically alters the MTJ and so it less of concern. Even if all three reference MTJs are in the magnetic state of low resistance, they are safely above the resistance of any successfully programmed antifuse.

Figure 3:
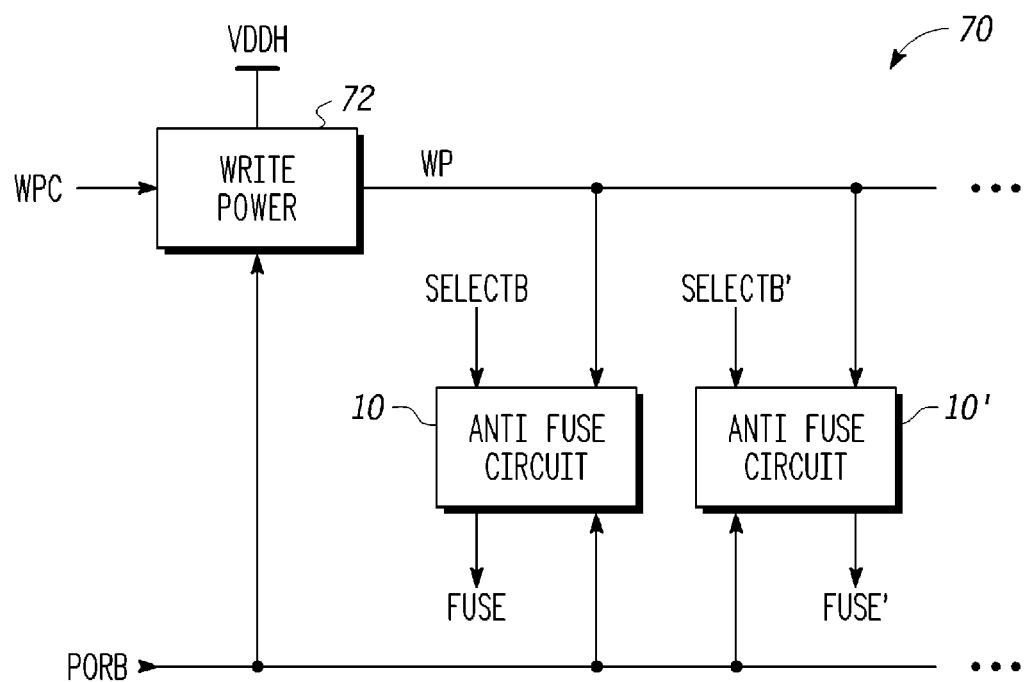
FIG. 3 is a block diagram of an antifuse system using antifuse circuits of the type shown in FIG. 1.

Shown in FIG. 3 is an antifuse system 70 comprising a write power circuit 72, antifuse circuit 10, and an antifuse circuit 10'. Antifuse system also comprises additional antifuse circuits not shown. Antifuse circuit 10' is constructed the same as antifuse circuit 10 with the only difference being it receives a different SELECT signal. The antifuse circuits not shown also may be constructed the same as antifuse circuit 10. In the case of antifuse circuit 10', it receives a SELECT B' signal. In a programming operation, write power circuit 72 has a limited current drive capability. As the antifuse circuits that have relatively easy MTJs for programming are programmed, the current required for those is reduced by the foldback operation in the write circuits. For example, in antifuse circuit 10, transistor 60 becomes non-conductive to reduce the current required from write power signal WP allowing more current to be supplied to other antifuse circuits. This can be significant because it has been discovered that often, even with a thousand or more antifuses, there are a few with MTJs that require significantly more voltage and current to achieve programming. Thus a write power circuit can be designed with a sufficiently high power capability to program the easy MTJs and with each successful programming, more power is available for programming the remaining MTJs. Especially since it is only a few MTJs that are typically difficult and the difference between difficult and easy is relatively large, it can be a significant savings in the area required on the integrated circuit for write power circuit 72 to use the foldback technique of write circuit 20 to only supply limited power initially then using the increased power availability as MTJs are programmed to program the difficult MTJs.

An antifuse circuit has a sensing circuit, an antifuse magnetic tunnel junction, a plurality of reference magnetic tunnel junctions, and a write circuit. The sensing circuit has a first input, a second input and an output, the output of the sense amplifier providing a logic value that indicates whether the antifuse circuit has a first resistance state or a second resistance state. The antifuse magnetic tunnel junction is coupled to the first input of the sensing circuit. The antifuse magnetic tunnel junction initially has the first resistance state which can be permanently changed to the second resistance state in response to receiving a predetermined program voltage. The plurality of reference magnetic tunnel junctions are coupled in parallel and to the second input of the sensing circuit. The plurality of reference magnetic tunnel junctions each have a resistance within a range to provide a collective resistance that can be determined by the sensing circuit to differ from each of the first resistance state and the second resistance state of the antifuse magnetic tunnel junction. The write circuit is coupled to the antifuse magnetic tunnel junction, the write circuit selectively providing a current sufficient to create the predetermined program voltage when the write circuit is enabled to program the antifuse magnetic tunnel junction. The plurality of reference magnetic tunnel junctions further comprise three reference magnetic tunnel junctions. The sensing circuit further comprises first and second isolation transistors. The first and second isolation transistors respectively are coupled to the first input and second input. The first and second isolation transistors each have a thicker gate oxide than other transistors within the sensing circuit that implement logic functions. The first and second isolation transistors electrically isolate the plurality of reference magnetic tunnel junctions and the antifuse magnetic tunnel junction from a power supply voltage used to power the sensing circuit and electrically isolate the sensing circuit from the predetermined program voltage. The first and second isolation transistors further comprise a control electrode connected together at a terminal for receiving a bias voltage. The bias voltage functions to limit a magnitude of voltage which is passed from a first current electrode to a second current electrode thereof for each of the first and second isolation transistors. The sensing circuit is controlled by a single control signal. The single control signal is used to precharge and equalize internal nodes of the sensing circuit and is asserted on power up and deaaserted after both a stable power supply voltage and a bias voltage have been applied to the sensing circuit. The sensing circuit comprises transistor circuitry having a symmetrical design and layout to provide accurate current sensing at the first input and the second input, the symmetrical design and layout minimizing effects of parasitic imbalance. The write circuit comprises transistors each having a thicker gate oxide than transistors within the sensing circuit implementing transistor logic functions and permitting a higher voltage to be applied to the antifuse magnetic tunnel junction than used to power the sensing circuit. The write circuit further comprises current limiting circuitry responsive to a reduction in resistance of the antifuse magnetic tunnel junction for reducing program current in the antifuse circuit from an initial value of program current. The write circuit further comprises a level shifter for interfacing from a signal having a logic signal value to a higher voltage potential used for the predetermined program voltage. The antifuse circuit is further used in a system. The system comprises a plurality of the antifuse circuits. Each antifuse circuit has an input coupled to a write power circuit for providing the predetermined program voltage wherein one or more of the plurality of the antifuse circuit is programmed to modify resistance states of a respective antifuse magnetic tunnel junction, and the write power circuit thereby prevents inadvertent programming during initial powering of the plurality of the antifuse circuit. Two or more of the plurality of the antifuse circuit are concurrently programmed to reduce programming time within the system. The antifuse circuit further comprises a plurality of select signals wherein each of the plurality of select signals is coupled to a predetermined one of the plurality of the antifuse circuit for selecting which of the plurality of the antifuse circuit are concurrently programmed.

A method for selectively programming an antifuse circuit comprises providing an antifuse magnetic tunnel junction initially having a first resistance state; coupling a write circuit to the antifuse magnetic tunnel junction for permanently changing the antifuse magnetic tunnel junction to the second resistance state by providing a predetermined program voltage, the write circuit; and limiting current from a first current applied to the antifuse magnetic tunnel junction to a lower second current in response to detecting a reduction in resistance of the antifuse magnetic tunnel junction. The method further comprises fixing the second current to be no current flowing to the antifuse magnetic tunnel junction. The method further comprises fixing the second current to be no current flowing to the antifuse magnetic tunnel junction.

An antifuse circuit comprises a sensing circuit, an antifuse magnetic tunnel junction, a reference resistance, and a write circuit. The sensing circuit has a first input, a second input and an output. The output of the sensing circuit provides a logic value that indicates whether the antifuse circuit has a first resistance state or a second resistance state. The antifuse magnetic tunnel junction is coupled to the first input of the sensing circuit. The antifuse magnetic tunnel junction initially has the first resistance state which can be permanently changed to the second resistance state in response to receiving a predetermined program voltage. The reference resistance is coupled to the second input of the sensing circuit. The reference resistance differs from each of the first resistance state and the second resistance state of the antifuse magnetic tunnel junction. The write circuit is coupled to the antifuse magnetic tunnel junction. The write circuit selectively provides a current sufficient to create the predetermined program voltage when the write circuit is enabled to program the antifuse magnetic tunnel junction and reducing the current to a predetermined lower value in response to detecting a change of resistance of the antifuse magnetic tunnel junction. The write circuit comprises transistors each having a gate oxide of at least a first thickness. The sensing circuit comprises a transistor for interfacing with the antifuse magnetic tunnel junction and has a gate oxide of at least the first thickness. The sensing circuit further comprises transistors having a gate oxide of at least a second thickness. The second thickness is smaller than the first thickness. The reference resistance further comprises a plurality of reference magnetic tunnel junctions coupled in parallel between a reference voltage terminal and the second input of the sensing circuit.

An antifuse circuit comprises a sensing circuit, an antifuse magnetic tunnel junction, a reference resistance, and a write circuit. The sensing circuit has a first input, a second input and an output. The output of the sensing circuit provides a logic value that indicates whether the antifuse circuit has a first resistance state or a second resistance state. The antifuse magnetic tunnel junction is coupled to a first transistor of the sensing circuit at the first input of the sensing circuit. The antifuse magnetic tunnel junction initially has the first resistance state which can be permanently changed to the second resistance state in response to receiving a predetermined program voltage. The reference resistance is coupled to the second input of the sensing circuit. The reference resistance differs from each of the first resistance state and the second resistance state of the antifuse magnetic tunnel junction. The write circuit is coupled to the antifuse magnetic tunnel junction. The write circuit selectively provides a current sufficient to create the predetermined program voltage when the write circuit is enabled to program the antifuse magnetic tunnel junction. The write circuit further comprises transistors each having a gate oxide of at least a first thickness. The first transistor of the sensing circuit also has a gate oxide of at least the first thickness. The sensing circuit further comprises transistors having a gate oxide of at least a second thickness, the second thickness being smaller than the first thickness. The reference resistance further comprises a plurality of reference magnetic tunnel junctions coupled in parallel between a reference voltage terminal and the second input of the sensing circuit.

Various changes and modifications to the embodiments herein chosen for purposes of illustration will readily occur to those skilled in the art. For example, transistor types may be reversed with a corresponding switch in logic state applied on the gate. Also other types of antifuses may benefit from this invention. To the extent that such modifications and variations do not depart from the spirit of the invention, they are intended to be included within the scope thereof which is assessed only by a fair interpretation of the following claims.

What is claimed is:

1. An antifuse circuit comprising:
    a sensing circuit having a first input, a second input and an output, the output of the sensing circuit providing a logic value that indicates whether the antifuse circuit has a first resistance state or a second resistance state;
    an antifuse magnetic tunnel junction coupled to the first input of the sensing circuit, the antifuse magnetic tunnel junction initially having the first resistance state which can be permanently changed to the second resistance state in response to receiving a predetermined program voltage;
    a reference resistance coupled to the second input of the sensing circuit, the reference resistance differing from each of the first resistance state and the second resistance state of the antifuse magnetic tunnel junction; and
    a write circuit coupled to the antifuse magnetic tunnel junction, the write circuit selectively providing a first current sufficient to create the predetermined program voltage when the write circuit is enabled to program the antifuse magnetic tunnel junction and reducing the first current to a second current predetermined value lower than the first current in response to detecting a change of resistance of the antifuse magnetic tunnel junction while applying the first current, wherein the write circuit comprises transistors each having a gate oxide of at least a first thickness, the sensing circuit comprises a transistor for interfacing with the antifuse magnetic tunnel junction and having a gate oxide of at least the first thickness, the sensing circuit farther comprising transistors having a gate oxide of at least a second thickness, the second thickness being smaller than the first thickness.

* * * * *